US 6,566,663 B1

(12) United States Patent
Kamijo et al.

(10) Patent No.: US 6,566,663 B1
(45) Date of Patent: May 20, 2003

(54) CHARGED-PARTICLE-BEAM OPTICAL COMPONENTS AND SYSTEMS INCLUDING FERRITE EXHIBITING REDUCED IMAGE DISPLACEMENT FROM TEMPERATURE FLUCTUATIONS

(75) Inventors: Koichi Kamijo, Kumagaya (JP); Shinichi Kojima, Kumagaya, NY (US); Katsushi Nakano, Kumagaya (JP); Kazuya Okamoto, Fishkill, NY (US)

(73) Assignee: Nikon Corporation, Tokyo (JP)

( * ) Notice: Subject to any disclaimer, the term of this patent is extended or adjusted under 35 U.S.C. 154(b) by 58 days.

(21) Appl. No.: 09/788,123

(22) Filed: Feb. 16, 2001

(30) Foreign Application Priority Data

Feb. 18, 2000 (JP) .................................. 2000-041521
Feb. 18, 2000 (JP) .................................. 2000-041522
Mar. 23, 2000 (JP) .................................. 2000-082634

(51) Int. Cl.[7] ............................................ H01J 37/141
(52) U.S. Cl. ............................. 250/492.2; 250/396 ML
(58) Field of Search .................... 250/492.2, 492.22, 250/396 R, 396 ML

(56) References Cited

U.S. PATENT DOCUMENTS 6,380,545 B1 * 4/2002 Yan ....................... 250/396 ML

* cited by examiner

Primary Examiner—Kiet T. Nguyen
(74) Attorney, Agent, or Firm—Klarquist Sparkman LLP

(57) ABSTRACT

Charged-particle-beam (CPB) optical components (e.g., electromagnetic lenses and deflectors) are disclosed that exhibit very low to no image displacement or loss of focus accompanying changes in temperature of the optical components during use. An optical component includes a unit of ferrite (typically in a ferrite stack). The ferrite is configured to exhibit substantially no permeability change with a change in temperature relative to normal operating temperature, thereby maintaining image displacement caused by permeability changes to below a predetermined threshold. As the ferrite temperature T rises to T', the saturation magnetic flux density $B_s$ of the ferrite decreases while the initial permeability $\mu_i$ increases. Thus, the initial magnetization curves of the ferrite intersect at a particular magnetic field intensity H, which exhibits substantially no change from T to T'. With $H_{AC}$ being the particular magnetic field intensity, the ferrite is selected so that the magnetic field intensity acting on the ferrite during operation is near $H_{AC}$.

22 Claims, 7 Drawing Sheets

CHARGED-PARTICLE-BEAM OPTICAL COMPONENTS AND SYSTEMS INCLUDING FERRITE EXHIBITING REDUCED IMAGE DISPLACEMENT FROM TEMPERATURE FLUCTUATIONS

FIELD OF THE INVENTION

This invention pertains to microlithography (projection-transfer of a pattern, defined by a reticle or mask, onto a sensitive substrate using an energy beam). Microlithography is a key technique used in the manufacture of microelectronic devices such as semiconductor integrated circuits, displays, micromachines, and the like. More specifically, the invention pertains to microlithography performed using a charged particle beam, such as an electron beam or ion beam, as the energy beam. Even more specifically, the invention pertains to charged-particle-beam (CPB) microlithography apparatus and methods exhibiting reduced aberrations such as image displacement caused by temperature changes in the column containing the CPB optical system of such apparatus.

BACKGROUND OF THE INVENTION

Advancement of microelectronics technology has been accompanied by a relentless drive toward increased miniaturization and higher density of circuit integration. Higher integration and circuit density require correspondingly smaller linewidths of constituent circuit elements. Currently, the required linewidths of integrated circuits are so small that optical microlithography (microlithography performed using ultraviolet light) often cannot provide the necessary pattern resolution. This situation has led to investigations into alternative microlithography technologies offering prospects of substantially better resolution than obtainable with optical microlithography.

One alternative microlithography technology receiving considerable attention is charged-particle-beam (CPB) microlithography, which utilizes a charged particle beam (e.g., electron beam or ion beam) as a pattern-transfer energy beam. Several CPB microlithography approaches have been the subject of intensive research and development effort, and each approach has respective advantages and disadvantages. One approach offering prospects of reasonably good resolution and throughput is the so-called "divided reticle" projection-transfer approach.

Divided-reticle projection transfer involves dividing the pattern, as defined on a reticle, into multiple individual exposure units usually termed "subfields." Each subfield is exposed individually by projection onto a respective region on the wafer. The subfield images are transferred to the wafer so that, after exposing all the subfields, the subfield images are "stitched" together in a contiguous manner to form the entire chip pattern. As each subfield is exposed, corrections can be made to achieve proper focus and reduction of aberrations (e.g., distortion) for the particular subfield. Divided-reticle projection transfer allows exposures to be made over an optically wide field with much better resolution and accuracy than obtainable by projection-exposing the entire reticle in one shot using a charged particle beam.

Certain aspects of divided-reticle projection transfer are shown in FIGS. 9 and 10. FIG. 9 depicts a wafer showing the intended sites of multiple "chips" or "dies." As exposed, each chip comprises multiple "stripes," and each stripe comprises multiple subfields arranged in rows. This same divided arrangement of stripes and subfields is used to define the pattern on the reticle. FIG. 10 depicts an actual exposure. For exposure, the reticle and wafer are mounted on respective stages (not shown but well understood in the art) configured to move the reticle and wafer horizontally (in the figure) as required for exposure. During exposure of a stripe (a portion of which is shown), the reticle stage and wafer stage both move along the longitudinal line of the respective stripes. Movements of the reticle and wafer are at constant respective velocities (but in opposite directions) in accordance with the demagnification ratio of the projection lens. Meanwhile, the charged particle beam incident on the reticle (the beam upstream of the reticle is termed the "illumination beam" and passes through an "illumination-optical system" to the reticle) illuminates the subfields on the reticle row-by-row and subfield-by-subfield within each row. The rows extend perpendicularly to the movement directions of the reticle and wafer. As each subfield is illuminated in this manner, the portion of the illumination beam passing through the respective subfield (now termed the "patterned beam" or "imaging beam") passes through a projection-optical system (including the projection lens) to the wafer.

During exposure of a stripe, to expose the subfields within each row of the stripe in a sequential manner, the illumination beam is deflected at right angles to the movement direction of the reticle stage, and the patterned beam is deflected at right angles to the movement direction of the wafer stage. After completing exposure of each row, the illumination beam is deflected in the opposite direction, as shown in FIG. 10, to expose the subfields in the next row of the stripe. This exposure technique reduces extraneous deflections of the beam and improves throughput.

In a divided reticle, as noted above, each subfield defines a respective portion of the pattern. Usually, each subfield is surrounded by "struts" (relatively thick structural members that collectively strengthen and provide rigidity to the reticle) and by a "skirt" (a thin non-patterned zone adjacent to the struts and surrounding the patterned region of the subfield). The struts extend from non-patterned portions of the reticle located between the subfields. The skirt helps to provide illumination isolation for each subfield to avoid illumination of adjacent subfields whenever a particular selected subfield is being illuminated.

In a conventional CPB projection-microlithography apparatus, a portion located between the reticle 3 and substrate 4 is shown in FIG. 11. Specifically shown are first and second projection lenses 1, 2, respectively, arranged on an optical axis 6. Associated with the first projection lens 1 is a deflector 7 and a ferrite stack 9, wherein the ferrite stack 9 is located in a radial space between the first projection lens 1 and the deflector 7. Associated with the second projection lens 2 is a deflector 8 and ferrite stack 10, wherein the ferrite stack 10 is located in a radial space between the second projection lens 2 and the deflector 8. Also shown is a scattering aperture 5 centered on the axis 6 and located where the beam ("patterned beam") forms a crossover. An exemplary beam trajectory 11 from the reticle 3 to the substrate 4 is shown.

Each ferrite stack 9, 10 typically comprises alternating rings of non-magnetic ferrite and of high-permeability ferrite stacked atop one another coaxially with the axis 6. Hence, the ferrite stacks 9, 10 are each symmetrical to the same axis as the optical axis 6. The inside diameter, outside diameter, thickness, etc., are determined so as to satisfy the desired parameters provided. In some configurations, the non-magnetic ferrite is not included in the ferrite stack, but rings of the non-magnetic ferrite generally are included with the rings of high-permeability ferrite to improve the positional accuracy of the high-permeability ferrite.

The reticle 3 is irradiated by an electron "illumination beam" passing through an "illumination-optical system" (not shown but understood to be located upstream of the reticle 3). Hence, the portion shown in FIG. 11 is the "projection-optical system." A combination of an illumination-optical system and projection-optical system as used in a CPB projection-microlithography apparatus is referred to herein as a CPB optical system. As projected onto the substrate 4, the image of the illuminated portion of the reticle 3 is "demagnified" by which is meant that the image as formed on the substrate 4 is smaller (usually by a factor that is the reciprocal of an integer) than the corresponding reticle portion illuminated by the illumination beam.

By "sensitive" is meant that the substrate 4 is coated with a suitable "resist" material that responds, to exposure by the patterned beam, in an image-forming way. I.e., when exposed to the patterned beam, a latent image of the image carried by the patterned beam is formed in the resist.

The scattering aperture 5, situated between the projection lenses 1,2, blocks downstream propagation of charged particles of the patterned beam that were scattered as they passed through the reticle 3. The deflector 7, when appropriately energized, urges the patterned beam, propagating from a specified location on the reticle 3, to propagate downstream of the reticle 3 along the desired trajectory 11 and through the scattering aperture 5. The deflector 8, when appropriately energized, urges the patterned beam passing through the scattering aperture 5 to a specified location on the substrate 4 where the image is formed. The deflectors 7, 8 also reduce distortion and aberrations of the patterned beam.

The ferrite stacks 9, 10 serve, inter alia, to prevent the creation of eddy currents in the metal constituting the lenses 1,2, respectively. The eddy currents arise from the effects of alternating-current (AC) magnetic fields created by the deflectors 7, 8, respectively. More specifically, the ferrite stacks 9, 10 shield the patterned beam from unintended magnetic fields, and can be used to adjust the profile of the respective lens magnetic fields that are not quite optimal due to manufacturing errors in the respective lenses. The ferrite also ensures that the magnetic fields created by the lenses 1, 2 are more efficiently formed and utilized in the region of the optical axis 6. Also, ferrite is used in the cores of deflectors 7, 8.

In divided-reticle CPB microlithography, high throughput can be achieved by using a relatively high beam current in the illumination-optical and projection-optical systems. However, higher beam currents tend to generate more "Coulomb effects." A Coulomb effect is caused by the mutual repulsion between individual charged particles of the beam, which tends to reduce focus and image sharpness. Coulomb effects can be reduced by accelerating the charged particle beam at a higher voltage or reducing the axial distance between the reticle and the substrate. In either instance, however, to achieve the desired beam trajectory, the electrical current supplied to lenses and deflectors in the CPB optical system must be increased correspondingly. Increasing the electrical power supplied to lenses and deflectors causes these components to exhibit correspondingly more heating.

In divided-reticle CPB projection-microlithography, throughput is increased by reducing the number of times the substrate is "stepped" mechanically to a new position for exposure of a row of subfields, which can be achieved by widening the lateral range of beam deflection. I.e., starting and stopping motions of the wafer stage and reticle stage consume time. Widening the lateral range of beam deflection reduces the number of times that this mechanical stepping must be performed for exposure of each die, thereby reducing the time required for exposure of each die. By reducing the exposure time per die, the time required to expose a wafer is reduced and throughput is increased correspondingly. However, the lateral distance in which the beam can be deflected is proportional to the excitation current supplied to the responsible deflector, and increasing the excitation current typically results in correspondingly more heating of the deflector.

The heating of lenses and deflectors, as discussed above, from actions taken to increase throughput is significant and can affect the quality of the microlithographic exposure in an adverse manner. For example, if heating of a lens or deflector of the CPB optical system occurs while making an actual exposure, an undesired change can occur in the shape of the magnetic field produced by the lens or deflector. The magnitude of change depends upon the temperature increase experienced by the lens or deflector and the material from which the lens or deflector is made. Even though conventional electromagnetic lenses are designed to minimize temperature fluctuations, undesired temperature fluctuations still occur, which prevent conventional CPB microlithography apparatus from providing optimal resolution and image quality.

SUMMARY OF THE INVENTION

From investigations into the causes of residual temperature fluctuations of lenses and deflectors used in the charged-particle-beam (CPB) optical system, it has been discovered that a previously overlooked factor was responsible. Namely, the ferrite stacks 9, 10, situated between deflectors and lenses, are subject to temperature changes. These temperature changes normally are accompanied by changes in the magnetic flux density along the optical axis of the CPB optical system and can cause increased image displacement and loss of focus at the substrate.

A first aspect of the invention is directed, in the context of a CPB exposure method, to methods for reducing image displacements caused by temperature fluctuations in the lens assembly. In an embodiment of such a method, an allowable range of image displacement is determined. The image displacement is that caused by the ferrite stack experiencing a temperature change, from its normal operating temperature, within a specified temperature range during exposure. Based on a ferrite-composition parameter and/or a ferrite-fabrication parameter, a ferrite is selected for use in the ferrite stack. The selected ferrite is one that exhibits, with a change in ferrite temperature from a normal operating temperature within the specified temperature range, a sufficiently low change in permeability. The change in permeability is sufficiently low so that, if the ferrite experiences a temperature change from the normal operating temperature within the specified temperature range during exposure, the image displacement is within the allowable range. The lens assembly is configured with a ferrite stack including the selected ferrite.

According to another aspect of the invention, CPB exposure apparatus are provided. An embodiment of such an apparatus comprises a lens assembly comprising an electromagnetic lens and/or a deflector arranged relative to an optical axis. The lens assembly includes a ferrite stack situated between the optical axis and the lens and/or deflector. The ferrite stack comprises ferrite exhibiting a change in permeability, with a change in temperature from a normal operating temperature of the ferrite stack, resulting in an image displacement, caused by a change in permeability of the ferrite, of 1 nm or less per 0.01° C. temperature change of the ferrite stack from the normal operating temperature during exposure.

According to another aspect of the invention, CPB optical components are provided for a CPB optical system for transferring an image of a pattern to a substrate. The CPB optical components include a unit of ferrite exhibiting first and second initial magnetization curves for different temperatures. The initial magnetization curves intersect each other at a preselected magnetic field intensity.

In one embodiment, the unit of ferrite exhibits a saturation magnetic flux density that decreases with an increase in ferrite temperature relative to a normal operating temperature of the ferrite. Also, a slope of the initial magnetization curve at the normal operating temperature of the ferrite is positive. In other words, a secondary peak of initial permeability has an apex at a temperature higher than the normal operating temperature of the ferrite.

In another embodiment, the unit of ferrite exhibits (a) a saturation magnetic flux density that decreases with an increase in ferrite temperature relative to a normal operating temperature of the ferrite, and (b) a maximum permeability that increases with an increase in ferrite temperature relative to the normal operating temperature of the ferrite.

In yet another embodiment, the unit of ferrite exhibits a saturation magnetic flux density that increases with an increase in ferrite temperature relative to a normal operating temperature of the ferrite. Also, a slope of the initial magnetization curve at the normal operating temperature of the ferrite is negative. In other words, a secondary peak of initial permeability has an apex at a temperature lower than the normal operating temperature of the ferrite.

In yet another embodiment, the unit of ferrite exhibits (a) a saturation magnetic flux density that increases with an increase in ferrite temperature relative to a normal operating temperature of the ferrite, and (b) a maximum permeability that decreases with an increase in ferrite temperature relative to the normal operating temperature of the ferrite.

Any of the CPB optical components summarized above can include an electromagnetic lens arranged relative to an optical axis, and a ferrite stack situated adjacent the electromagnetic lens. When energized, the electromagnetic lens produces a DC magnetic field at the optical axis. The ferrite stack comprises the unit of ferrite. In this configuration, the preselected magnetic field intensity at which the first and second initial magnetization curves intersect desirably is nearly the same as the intensity of the DC magnetic field. This configuration further can include a deflector arranged relative to the electromagnetic lens and the optical axis. The deflector when electrically energized produces an AC magnetic field at the optical axis, and the ferrite stack is situated adjacent the deflector and the electromagnetic lens. In the configuration including both a lens and deflector, the preselected magnetic field intensity at which the first and second initial magnetization curves intersect is nearly the same as a sum of the intensity of the DC magnetic field and the intensity of the AC magnetic field. Furthermore, the deflector and the electromagnetic lens can be operated to cause a B-H curve of the ferrite to exhibit a local loop, wherein the center of the local loop corresponds to a magnetic field intensity that exhibits substantially no change with changes in the ferrite temperature relative to the normal operating temperature of the ferrite.

Yet another embodiment of the CPB optical component includes a deflector arranged relative to the optical axis. When electrically energized, the deflector produces an AC magnetic field at the optical axis. The component also includes a ferrite stack, situated adjacent the deflector, that includes the unit of ferrite. In this configuration, the preselected magnetic field intensity at which the first and second initial magnetization curves intersect desirably is nearly the same as the intensity of the AC magnetic field.

According to another aspect of the invention, CPB optical systems and CPB exposure systems are provided that comprise any of the CPB optical components summarized above.

The foregoing and additional features and advantages of the invention will be more readily apparent from the following detailed description, which proceeds with reference to the accompanying drawings.

DETAILED DESCRIPTION

General Considerations

Certain aspects of the invention as described below are in the context of using an electron beam as a representative charged particle beam. It will be understood that the principles of the invention can be applied with equal facility to the use of an alternative charged particle beam, such as an ion beam. Also, the following discussion is in the context of a charged-particle-beam (CPB) optical system as used in a CPB projection-microlithography apparatus. It will be understood that the principles of the invention can be applied with equal facility to CPB optical systems as used in other types of CPB apparatus, e.g., microscopes.

As noted above, it has been discovered that the ferrite stacks 9, 10, normally situated between the lenses 1, 2 and the respective deflectors 7, 8, are subject to temperature changes that can result in increased image displacement and loss of focus at the substrate. Conventionally, ferrite stacks are cooled actively, using a coolant, at a fixed heat-removal rate. Despite such cooling, the heat generated by the coils of a deflector change with the frequency of beam scanning and application of dynamic correction. Hence, simply cooling the ferrite stack with a coolant is insufficient for preventing all significant changes in ferrite-stack temperature.

According to the invention, the ferrite used in the ferrite stack is formulated and/or fabricated so as not to affect the charged particle beam significantly even if the temperature of the ferrite stack experiences a temperature change. Hence, CPB microlithography apparatus are provided that exhibit reduced image displacement and loss of focus compared to conventional apparatus.

Figure 1:
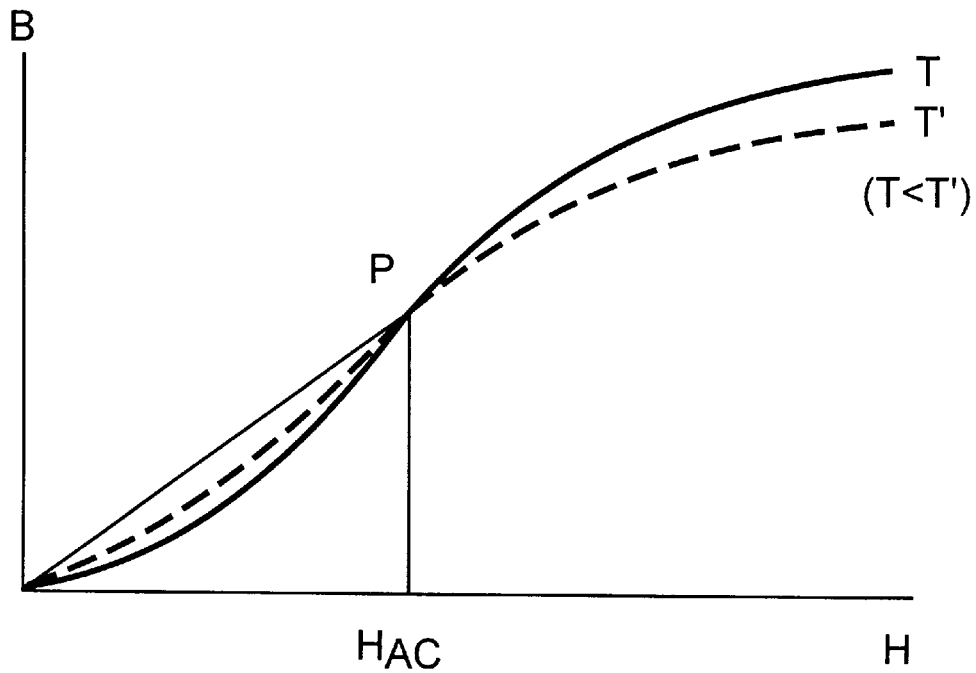
FIG. 1 shows an example of respective B-H curves ("initial magnetization" curves) of ferrite at different temperatures T, T'.

To such end, the ferrite used in making the ferrite stacks 9, 10 is formulated and/or fabricated such that the initial magnetization curves of the ferrite at different temperatures intersect one another at a particular desired magnetic field strength. FIG. 1 shows an example of respective B-H curves ("initial magnetization" curves) at different temperatures T, T'. The depicted B-H curves intersect each other at a point P. I.e., with a temperature increase from T to T', the saturation magnetic flux density $B_s$ of the ferrite is decreased and the initial permeability $\mu_i$ of the ferrite is increased. As a result, the respective initial magnetization curves intersect at a point P. The point P exhibits little to no change in position with changes in temperature of the ferrite. The magnetic field intensity at the point P is denoted $H_{AC}$.

Let the magnetic field intensity applied to the ferrite by the respective deflector be equal to $H_{AC}$. The permeability of the ferrite is calculated by dividing a permeability, corresponding to the magnetic flux density B and the maximum magnetic field intensity H whenever an AC magnetic field (having a time-average magnitude of zero) is applied to demagnetized ferrite, by the vacuum permeability $\mu_0$. This calculation is equivalent to dividing the slope of a straight line, from the point P (on the initial magnetization curve at $H_{AC}$) to the origin, by the vacuum permeability $\mu_0$.

In an actual CPB microlithography apparatus, a deflector creates an AC magnetic field, as described above, to deflect the charged particle beam laterally. Conventionally, whenever a ferrite stack is located adjacent such a deflector and the ferrite stack experiences a temperature change, the permeability of the ferrite exhibits a corresponding fluctuation. This permeability fluctuation typically causes beam drift, which can affect exposure in an adverse manner. Nevertheless, the AC magnetic field intensity created by the deflector is essentially constant. According to an aspect of the invention, the properties of the ferrite are adjusted so that the permeability of the ferrite at the AC magnetic field intensity created by the deflector experiences no change with temperature. As a result, the temperature stability of the ferrite is increased.

The particular ferrite used in the ferrite stack desirably is selected so that the magnetic field intensity created by the respective deflector at the ferrite stack is equal to $H_{AC}$. Under such conditions, the permeability of the ferrite experiences no significant change whenever the ferrite is at its normal operating temperature or the temperature of the ferrite experiences a change (e.g., temperature rise) from its normal operating temperature. (Within a temperature range in which the initial magnetization curves for each temperature intersect at the point P, the permeability does not change. The range of temperature depends upon material properties and the design specifications.) In other words, even if the temperature of the ferrite changes, no change in magnetic flux density B as created by the deflector occurs on the optical axis, resulting in no adverse effect on the charged particle beam.

Figure 2:
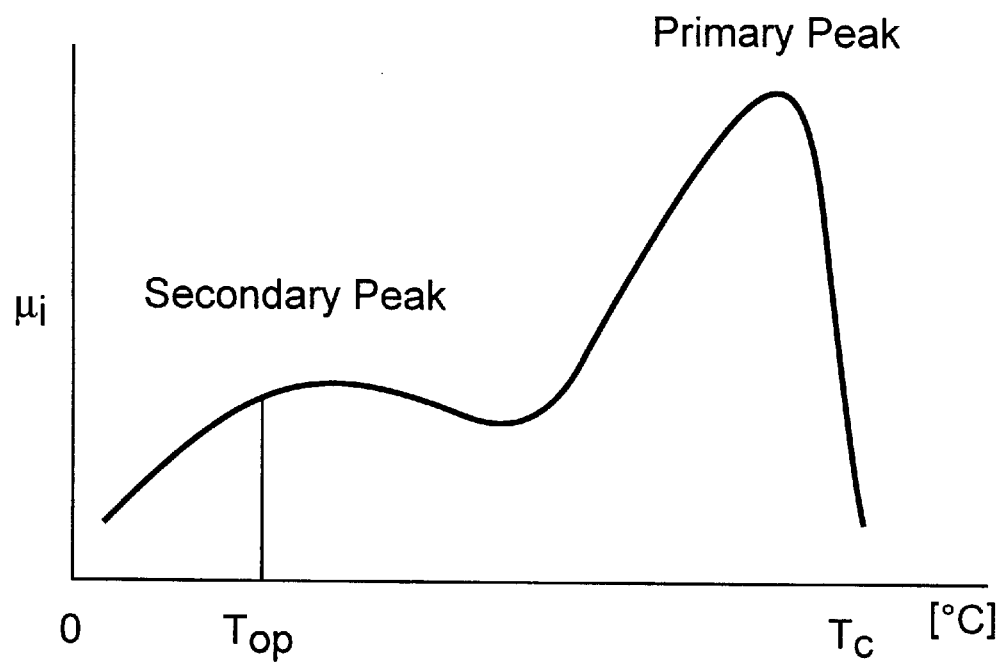
FIG. 2 is a plot of an exemplary relationship of the initial permeability $\mu_i$ of ferrite to temperature.

The ferrite can be formulated such that its saturation magnetic flux density $B_s$ decreases with increases in temperature (see FIG. 3); and a "secondary peak" of initial permeability $\mu_i$ of the ferrite occurs at a temperature higher than the normal operating temperature $T_{op}$ of the ferrite. FIG. 2 is a plot of the relationship of the initial permeability $\mu_i$ of ferrite to temperature. The plot exhibits two peaks, of which the higher (right-hand) peak is called the "primary" peak and the lower (left-hand) peak is called the "secondary" peak. The apex of the primary peak is at a temperature just below the Curie point ($T_c$) of the ferrite. With ferrites, the Curie point is strongly dependent upon the specific composition and fabrication parameters of the specific ferrite material, but generally is approximately 200° C. I.e., the Curie point (and the position on the abscissa of the apex of the primary peak) can be changed by making changes in, for example, the composition of the ferrite material or the temperature at which the ferrite is fired. Also, the position on the abscissa of the apex of the secondary peak can be adjusted by making changes in the composition and/or fabrication parameters of the ferrite. By making these changes in one or both the primary and secondary peaks, the shape and location of the valley between the primary and secondary peaks can be changed as desired.

As a result of adjusting the position of the secondary-peak apex to a temperature higher than the ferrite normal operating temperature $T_{op}$, if the ferrite temperature is increased to above the normal operating temperature $T_{op}$, then the initial permeability $\mu_i$ of the ferrite exhibits a corresponding increase. In ferrites, if the saturation magnetic flux density $B_s$ decreases with an increase in temperature, then the initial magnetization curves of the ferrite at different temperatures always intersect one another. Hence, by adjusting the composition and/or fabrication parameters of the ferrite, the initial magnetization curves of the ferrite at different temperatures can be made to intersect each other at a desired magnetic field intensity.

In FIG. 1, the location of the point P, which is where the initial magnetization curves intersect, can be set at will by adjusting the position and amplitude of the secondary peak apex. In other words, in FIG. 2, the change in the slope of the curve of initial permeability $\mu_i$ accompanying a change in temperature at the normal operating temperature $T_{op}$ can be set at will. If a change in the slope of initial permeability $\mu_i$ occurs (with a change in temperature) that is larger than as shown in FIG. 2, then whenever the ferrite temperature changes, a larger change also occurs in the slope of the initial magnetization curve at the origin (FIG. 1). Under such conditions, the initial magnetization curve corresponding to the changed temperature intersects the initial magnetization curve corresponding to the normal operating temperature $T_{op}$ at a magnetic field intensity stronger than the actual magnetic field intensity. Hence, it is possible to suppress the effects of temperature fluctuations on the value of permeability whenever the magnetic field intensity is high.

Figure 3:
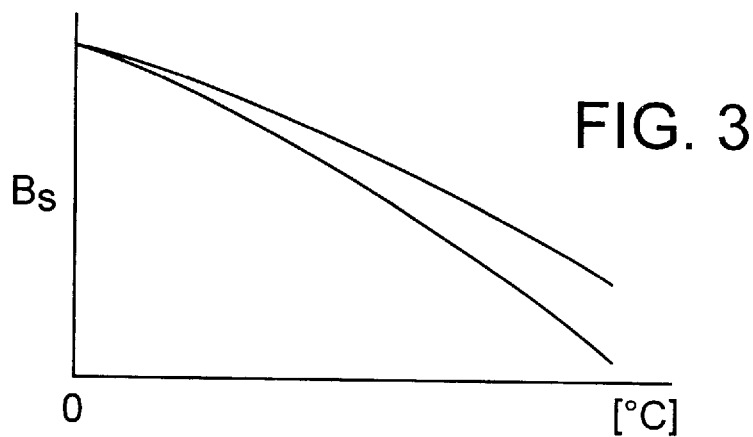
FIG. 3 is a plot showing an exemplary decrease in the saturation magnetic flux density $B_s$ of ferrite with increases in temperature.

The position P where the initial magnetization curves intersect can be adjusted by adjusting the temperature property of saturation magnetic flux density $B_s$ of ferrite (FIG. 3). As shown in FIG. 3, the saturation magnetic flux density $B_s$ of ferrite generally decreases with increases in temperature. The slope of the decrease can be changed by making changes in the composition of the ferrite and/or in the fabrication parameters (e.g., firing parameters). First, consider a situation in which the initial magnetization curves are assumed not to intersect whenever the apex of the secondary peak is at a temperature higher than the normal operating temperature $T_{op}$. Under these conditions, if the composition and/or fabrication parameters of the ferrite were established to provide a large slope to the curve of saturation magnetic flux density $\mu_m$ versus temperature (FIG. 3), then the magnetic flux density in the high-magnetic-field region of the initial magnetization curve (FIG. 1) would decrease rapidly with a rise in temperature. Thus, the location of the point P where the initial magnetization curves intersect can be shifted toward a lower magnetic field intensity.

Figure 4A:
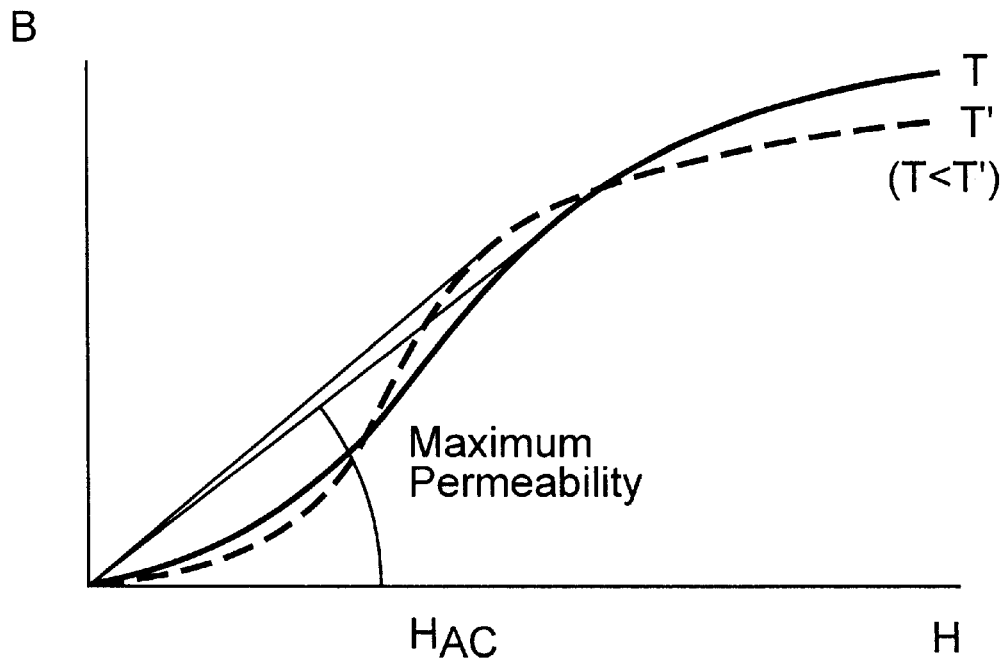
FIGS. 4(A) and 4(B) are respective plots showing exemplary intersections of initial magnetization curves of ferrite at multiple points.
Figure 4B:
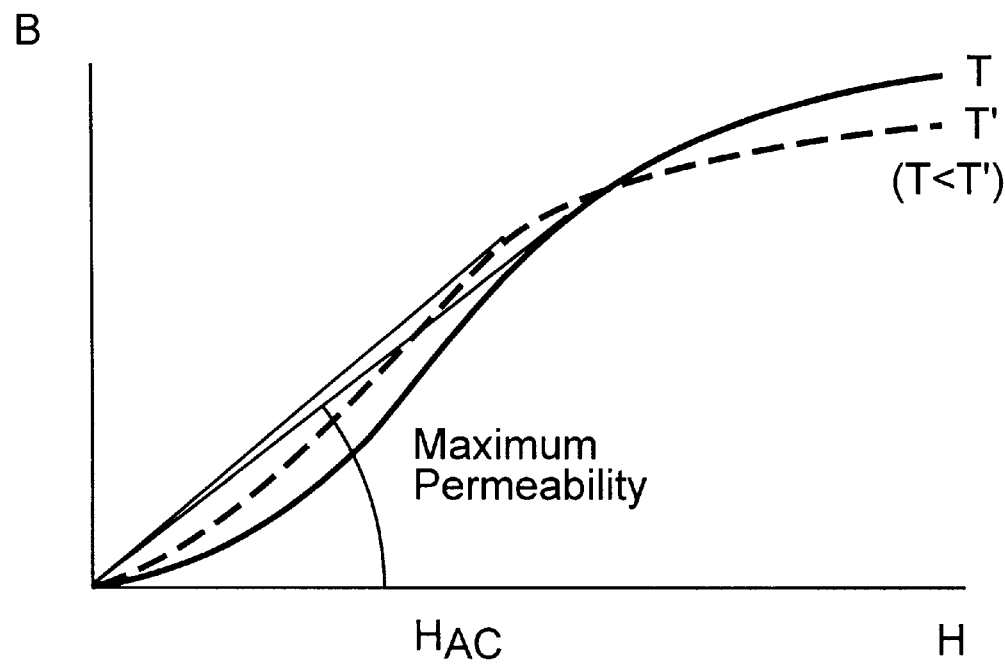

The ferrite can be formulated (by manipulating the composition and/or fabrication parameters) such that its saturation magnetic flux density $B_s$ decreases with increases in temperature, and its maximum permeability $\mu_m$ increases with increases in temperature. "Maximum permeability" $\mu_m$ of ferrite is a value of permeability determined by dividing the maximum slope of a line drawn from the origin to a point on the B-H curve of ferrite by the vacuum permeability $\mu_0$. As the saturation magnetic flux density $B_s$ of ferrite decreases with an increase in temperature, if the maximum permeability $\mu_m$ increases with the temperature increase, then the initial magnetization curves at different temperatures always intersect one another, as shown in FIGS. 4(A)–4(B). As shown in FIG. 4(A), the initial magnetization curves can intersect at multiple points.

A point where the initial magnetization curves intersect can be changed by changing the maximum permeability $\mu_m$ and the rate at which maximum permeability increases with increases in temperature (FIG. 4(B)). Maximum permeability $\mu_m$ and its rate of increase with increases in temperature can be given respective desired values by appropriately manipulating compositional and/or firing parameters of the ferrite. Also, the position where the initial magnetization curves intersect can be adjusted by adjusting the rate of change of saturation magnetic flux density $B_s$ with changes in temperature (FIG. 3).

Figure 5:
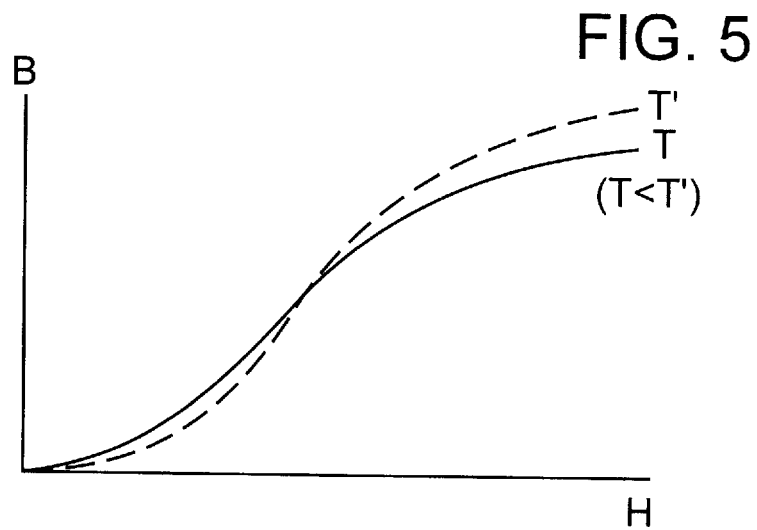
FIG. 5 is a plot showing an exemplary intersection of two initial magnetization curves of ferrite for different temperatures.

As noted above, the saturation magnetic flux density $B_s$ of ferrite usually decreases with increases in temperature. However, by making appropriate changes in ferrite composition and/or firing parameters, the saturation magnetic flux density $B_s$ can be caused to increase with increases in temperature. With such a ferrite, if the position of the apex of the secondary peak of initial permeability $\mu_i$ is at a lower temperature than the normal operating temperature $T_{op}$ of the ferrite, then the initial permeability $\mu_i$ will exhibit a decrease with increased temperature. Under these conditions, the initial magnetization curves at different temperatures still intersect one another, as shown in FIG. 5. The normal operating temperature $T_{op}$ of the ferrite desirably is lower than the temperature coordinate of the valley between the primary and secondary peaks of initial permeability $p_i$. (The normal operating temperature $T_{op}$ of the ferrite normally is not higher than this temperature coordinate under usual conditions in a CPB microlithography apparatus.)

The ferrite also can be formulated (by manipulating the composition and/or fabrication parameters) such that the saturation magnetic flux density $B_s$ increases with increases in temperature and the maximum permeability decreases with increases in temperature. Nevertheless, the initial magnetization curves at different temperatures intersect one another.

The magnetic field intensity H at the coordinate where the initial magnetization curves intersect can be substantially the same as the amplitude of the AC magnetic field created by the adjacent deflector. If no electromagnetic lens is located near the deflector, and the magnetic field applied to the ferrite originates substantially only from the adjacent deflector, then the ferrite can be selected so that the intensity of the magnetic field created by the adjacent deflector is $H_{AC}$. Thus, at the ferrite stack, the permeability does not change when the ferrite temperature is at the normal operating temperature $T_{op}$ or changes relative to $T_{op}$. I.e., if a change in temperature of the ferrite does occur, no change occurs in magnetic flux density on the optical axis, and no adverse effect to the beam occurs.

The magnetic field intensity H at the location where the initial magnetization curves intersect can be substantially the same as the magnetic field intensity H created by an electromagnetic lens adjacent the ferrite. The magnetic fields acting on ferrite inside a CPB optical system can be an AC magnetic field created by an adjacent deflector and/or a DC magnetic field created by an adjacent electromagnetic lens. In an "electromagnetic" lens as referred to herein, a direct current flows in a coil of the lens and generates a corresponding magnetic field that causes convergence of the charged particle beam passing axially through the lens. The magnetic flux density B in the region of the optical axis is not related to the permeability. Rather, the force that deflects and converges the beam of charged particles is the Lorentz force F, denoted as a vector product of magnetic flux density B and charge. In other words, whenever a DC magnetic field is applied to ferrite, the magnetic flux density B directly affecting the charged particles needs to be stabilized with respect to temperature.

Figure 6:
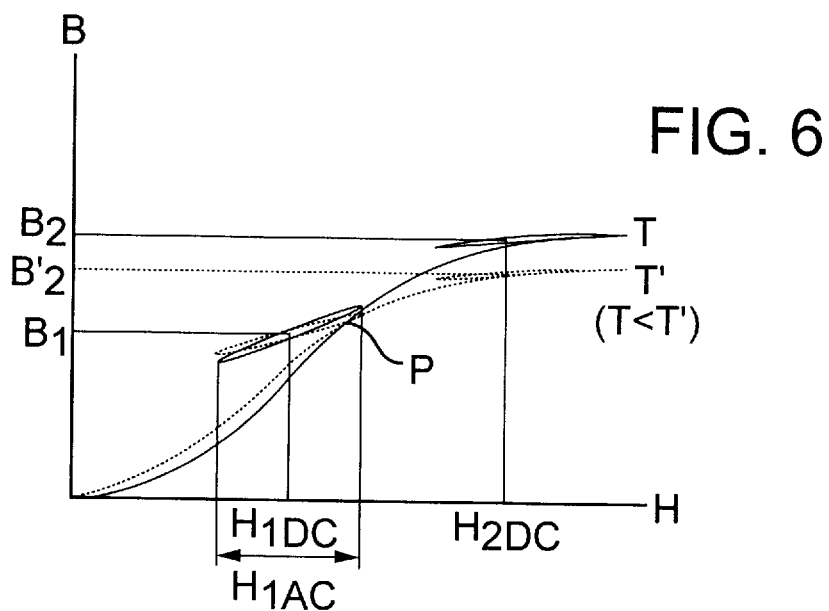
FIG. 6 includes exemplary plots of magnetic flux density created whenever a DC magnetic field created by an adjacent electromagnetic lens is applied to the ferrite, or an adjacent deflector applies an AC magnetic field to the ferrite while the DC magnetic field is being applied to the ferrite.

FIG. 6 is a plot of magnetic flux density B created whenever, first, a DC magnetic field created by an adjacent electromagnetic lens is applied to the ferrite and, second, an adjacent deflector applies an AC magnetic field to the ferrite in addition to the DC magnetic field. With respect to ferrite at its normal operating temperature $T_{op}$, as the intensity of the magnetic field generated by the electromagnetic lens reaches HI DC, the ferrite is magnetized according to an initial magnetization (B-H) curve (solid-line curve). The magnetic field intensity $H_{1DC}$ is slightly less than the magnetic field intensity corresponding to the point P where the B-H curves for initial magnetization for different ferrite temperature intersect. Next, when the deflector also is excited and a magnetic field intensity $H_{1AC}$ is created, the B-H curve inside the ferrite defines a small hysteresis loop. This is known as a "local loop" (local hysteresis loop) denoted by the solid-line ellipse centered on $H_{1DC}$ The "height" of any portion of the local loop on the ordinate is the corresponding instantaneous magnetic flux density B created in the ferrite; the numerical value of the magnetic flux density B changes with $H_{1DC}$ as indicated by the solid-line ellipse. If the ferrite temperature changes to T', then the initial magnetization profile changes to the curve denoted by the dotted line, and the local loop also changes to the loop (denoted by the dotted line) centered on $H_{1DC'}$. The curves of initial magnetization at the two temperatures T and T' intersect at the point P. As a result, whenever the temperature of the ferrite changes, the local loop experiences substantially no change in its central position even if the shape and/or orientation of the local loop changes. Hence, the magnetic flux density on the optical axis experiences substantially no fluctuation, and the beam position is stable with respect to temperature.

Consideration now is given to a situation in which the position of the point P (at which the curves of initial magnetization at different temperatures intersect) is separated from the DC magnetic field created by an adjacent coil of an electromagnetic lens. The intensity of the shifted DC magnetic field is denoted $H_{2DC}$, at which the initial magnetization curves change greatly with a change in ferrite temperature. Consequently, the center position of the local loop caused by excitation of the deflector also exhibits substantial shift with a change in ferrite temperature. In other words, the center position of the magnetic flux density B of the local loop inside the ferrite changes greatly from $B_2$ to $B'_2$ with a change in temperature from T to T', with a corresponding change in the magnetic flux density on the optical axis. As a result, the beam position is displaced with a major impact on exposure quality.

As used above, "substantially no" in the context of changes in local-loop position, image displacement, or fluctuation of magnetic flux density means that the subject position, displacement, or fluctuation is within a range that does not cause significant degradation of exposure from design specifications. The acceptable respective ranges of position, displacement, and/or fluctuation can be determined readily by a person of ordinary skill in the relevant art, according to the design parameters for the CPB apparatus.

In cases in which the positions of the electromagnetic lens and deflector are sufficiently separated from each other that the deflector exerts no effect on the ferrite, it is possible to minimize unwanted changes in electromagnetic lens performance due to changes in ferrite temperature. In this instance, the magnetic field intensity at the location where the initial magnetization curves intersect desirably are as close as possible to the magnetic field intensity created by the electromagnetic lens adjacent the ferrite.

If both an electromagnetic lens and a deflector are located adjacent the ferrite, then the magnetic field intensity at the location where the initial magnetization curves intersect desirably is nearly the same as the sum of the magnetic field intensity created by the adjacent electromagnetic lens and the AC magnetic field intensity created by the deflector. This configuration is especially useful whenever a DC magnetic field also is created by an adjacent deflector. In this context, "nearly the same" means that the center of the local loop of the B-H curve of the ferrite, due to excitation of the deflector, is sufficiently near a value that exhibits substantially no change as ferrite temperature changes. Referring further to FIG. 6, the local loop starts at a point where the profile of initial permeability is shifted, from the point where the DC magnetic field is applied, by exactly the amplitude of the AC magnetic field (shifted to the upper right in the drawing), and is separated from the initial permeability curve. If the initial AC excitation is applied in a direction that strengthens the magnetic field, then the local loop is formed above the initial permeability curve, as shown in the drawing. Hence, if $H_{1DC}$ in FIG. 6 is a magnetic field intensity corresponding to the point P and the ferrite temperature changes, then the center of the local loop changes. By making $H_{1DC}$ less than the magnetic field intensity corresponding to the point P, the center of the local loop exhibits substantially no change with changes in ferrite temperature. Similarly, whenever the initial AC excitation is applied in a direction that weakens the magnetic field, $H_{1DC}$ desirably is larger than the magnetic field intensity corresponding to the point P to ensure that the center of the local loop experiences substantially no change with changes in ferrite temperature.

The DC magnetic field intensity desirably is near a magnitude at which the center of the local loop experiences substantially no change with a change in ferrite temperature. As a result, the magnetic flux density on the optical axis experiences substantially no change, and the beam position is stable to changes in ferrite temperature. Furthermore, "near a magnitude at which the center of the local loop experiences substantially no change" means that displacement of the center position of magnetic flux density of the local loop is within a range that does not cause significant problems in exposure. The magnitude can be determined readily by a person of ordinary skill in the relevant art, according to the design parameters for the CPB apparatus.

Charged-Particle-Beam Optical System Embodiment

Figure 11:
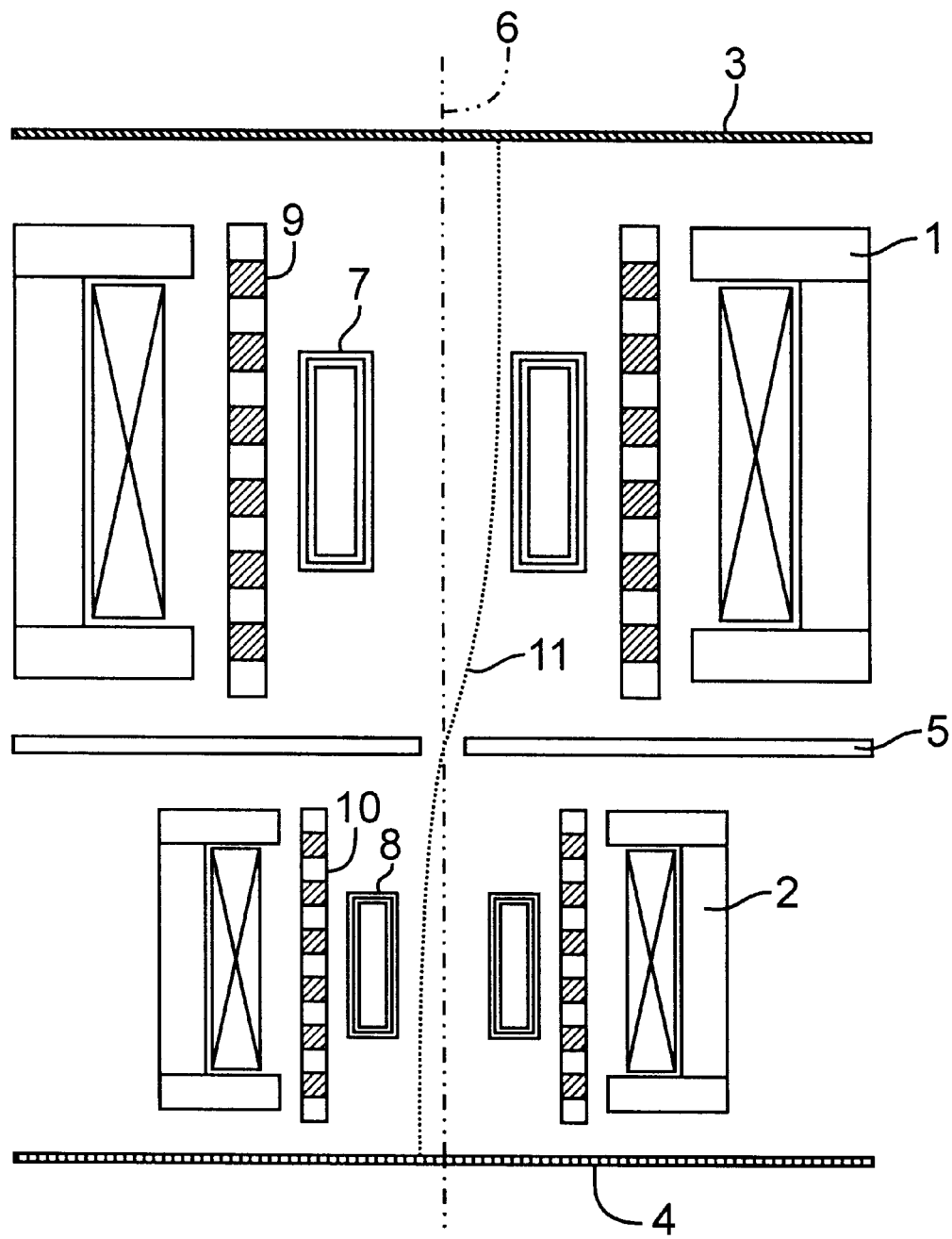
FIG. 11 schematically depicts, in vertical section, a representative projection-optical system of a CPB optical system.

A representative embodiment of a CPB optical system is configured as shown in FIG. 11, except for details of the ferrite stacks 9, 10. As described above, the ferrite stacks 9, 10 prevent the creation of eddy currents in the metal constituting the lenses 1, 2, respectively. The eddy currents arise from the effects of alternating-current (AC) magnetic fields created by the deflectors 7, 8, respectively. More specifically, the ferrite stacks 9, 10 shield the patterned beam from unintended magnetic effects, and can be used to adjust the profile of the respective lens magnetic fields that are not quite optimal due to manufacturing errors in the respective lenses. The ferrite also serves to make the magnetic fields created by the lenses 1, 2 act efficiently in the region of the optical axis 6.

A DC magnetic field intensity of $H_{1DC}$ (FIG. 6), produced by the lens 1 acts on the ferrite stack 9 in FIG. 11, as does an AC magnetic field $H_{1AC}$ produced by the deflector 7. The ferrite used in the ferrite stack 9 is selected (according to compositional and/or fabrication parameters) such that its saturation magnetic flux density $B_s$ decreases and its initial permeability $\mu_i$ increases with an increase in temperature. As a result, whenever the operating temperature of the ferrite changes from T to T', the initial magnetization curve shifts from the solid-line curve in FIG. 6 to the dotted-line curve. Both curves intersect at the point P. By adjusting the composition and/or fabrication parameters (e.g., firing parameters) of the ferrite, the magnetic field intensity corresponding to the point P is slightly higher than the DC magnetic field $H_{1DC}$.

Hence, whenever the AC magnetic field intensity $H_{1AC}$ produced by the deflector is applied in concert with the DC magnetic field centered on $H_{1DC}$, a local loop is created as denoted by the solid-line ellipse in FIG. 6. With a change in temperature to T', the local loop profile is as denoted by the dotted-line ellipse in FIG. 6, but the center of the dotted-line local loop exhibits substantially no change from the center of the solid-line local loop. As a result, even if the temperature of the ferrite in the stack 9 changes, no significant adverse effect is manifest on the charged particle beam propagating in an axial direction through the lens 1. The ferrite used in the stack 10 can be selected in a similar manner.

In a more general sense, and according to another aspect of the invention, an allowed range of image displacement in CPB microlithography is pre-determined. The subject image displacement is as caused by the ferrite stack experiencing a temperature change, from its normal operating temperature, within a specified temperature range. The ferrite in the ferrite stack is selected, based on compositional and/or fabrication parameters, so as to exhibit a change in permeability sufficiently low so that, if a temperature fluctuation occurs within the specified temperature range, the image displacement occurs within the allowed range of image displacement. Hence, the image displacement remains within a pre-designated specification. As noted above, the composition and fabrication parameters (e.g., firing conditions) are easy to select and control.

For example, the ferrite used in the ferrite stack can be selected to exhibit a change in permeability with change in temperature sufficiently low so that image displacements caused by permeability changes of the ferrite do not exceed 1 nm per 0.01° C. temperature change of the ferrite stack (from normal operating temperature) during operation of the CPB optical system.

In a CPB projection-microlithography apparatus, a typical change in temperature of the ferrite stack from normal operating temperature is about ±0.01° C., even in extreme cases. Notwithstanding this apparent small change, modern pattern-transfer accuracy requires that imaging displacements caused by changes in ferrite-stack temperature be 1 nm or less. According to the invention, this performance level is achieved by selecting and using a ferrite exhibiting substantially no change in permeability with change in ferrite temperature.

EXAMPLES

In these examples, and referring to FIG. 11, the axial distance between the reticle 3 and the substrate 4 was 600 mm. The respective excitation currents applied to the lenses 1, 2 were sufficient to produce, from an illuminated pattern portion on the reticle 3, a corresponding image on the substrate 4 measuring 0.25 mm square at a demagnification ratio of 1/4. The illumination beam illuminating the pattern portion on the reticle 3 had an aperture angle of 6 mrad. The illumination beam was incident on the surface of the substrate 4 at a position 2.5 mm from the optical axis 6.

In these examples, characteristics of the ferrite stack 9 were evaluated in a situation in which the magnitude of image displacement was measured when the ferrite temperature increased by 0.01° C. from a reference temperature of 25° C.

First, as a comparative example, ferrite A was used, having an initial permeability of 6000 at the reference temperature of 25° C. The rate of change of the initial permeability exhibited by ferrite A was 150 per unit (1° C.) change in temperature near the reference temperature. In the example, ferrite B was used, having an initial permeability of 7000 at the reference temperature of 25° C. The rate of change of the initial permeability exhibited by ferrite B was 11 per unit (1° C.) change in temperature near the reference temperature.

The image displacement Δx, occurring whenever the initial permeability of the ferrite stack 9 in the CPB optical system was changed by 1, is a function of the initial permeability $\mu_i$ of the ferrite at the calibration temperature. This image displacement is expressed by the following:

$$\Delta x = a_0 + a_1 \cdot \mu_i + a_2 \cdot \mu_i^2$$

$$a_0 = 3.487750 \times 10$$

$$a_1 = -7.916667 \times 10^{-3}$$

$$a_2 = 4.966667 \times 10^{-7}$$

The image displacement Δx occurring whenever the initial permeability $\mu_i$ changed by 1 was 5.26 nm for ferrite A (calibrated at 25° C.) and 3.80 nm for ferrite B (calibrated at 25° C.).

Accordingly, with respect to the ferrite stack 9, the magnitude of image displacement occurring when the temperature of the ferrite increased by 0.01° C. from the reference temperature of 25° C. was 7.89 nm when ferrite A was used, and 0.42 nm when ferrite B was used. Hence, configuring the ferrite stack using ferrite B substantially reduced the image displacement occurring with a change of ferrite temperature during an exposure. Generally, according to contemporary standards, an image displacement, per 0.01° C. temperature change, of 1 nm or less is regarded as satisfactory.

For a given ferrite stack, by calculating the image displacement per unit change in $\mu_i$ relative to a calibrated value of $\mu_i$, the rate of change of $\mu_i$ relative to temperature needed to keep the image displacement within a desired range can be determined easily for a ferrite of which $\mu_i$ at the calibration temperature is known.

Microelectronic-Device Fabrication

Figure 7:
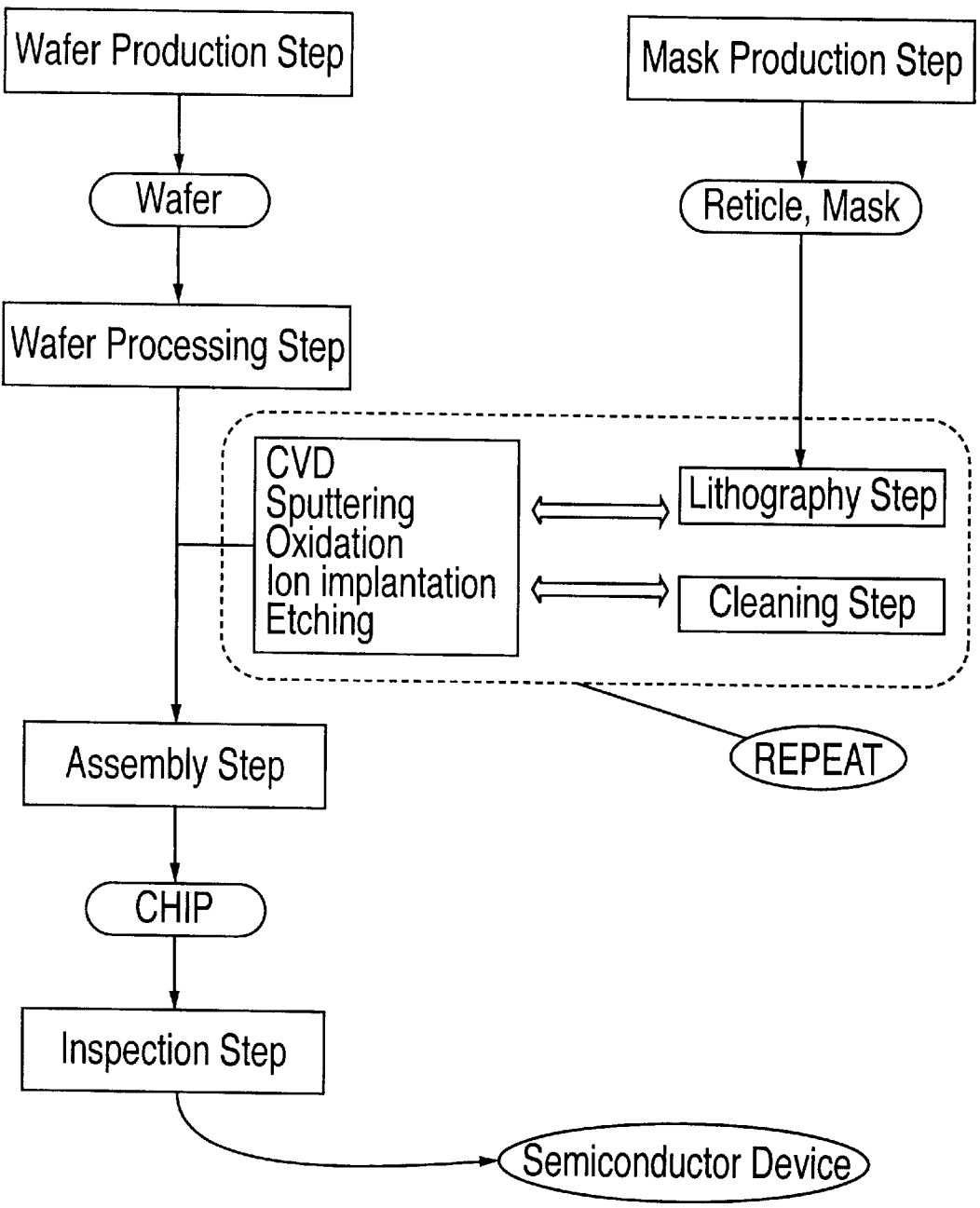
FIG. 7 is a process flow chart for manufacturing a microelectronic device, wherein the process includes a microlithography method according to the invention.

FIG. 7 is a flow chart of an exemplary microelectronic-device fabrication method to which apparatus and methods according to the invention can be applied readily. The fabrication method generally comprises the main steps of wafer production (wafer preparation), wafer processing, device assembly, and device inspection. Each step usually comprises several sub-steps.

Among the main steps, wafer processing is key to achieving the smallest feature sizes (critical dimensions) and best inter-layer registration. In the wafer-processing step, multiple circuit patterns are successively layered atop one another on the wafer, forming multiple chips destined to be memory chips or main processing units (MPUs), for example. The formation of each layer typically involves multiple sub-steps. Usually, many operative microelectronic devices are produced on each wafer.

Typical wafer-processing steps include: (1) thin-film formation (by, e.g., sputtering or CVD) involving formation of a dielectric layer for electrical insulation or a metal layer for connecting wires or electrodes; (2) oxidation step to oxidize the substrate or the thin-film layer previously formed; (3) microlithography to form a resist pattern for selective processing of the thin film or the substrate itself; (4) etching or analogous step (e.g., dry etching) to etch the thin film or substrate according to the resist pattern; (5) doping as required to implant ions or impurities into the thin film or substrate according to the resist pattern; (6) resist stripping to remove the remaining resist from the wafer; and (7) wafer inspection. Wafer processing is repeated as required (typically many times) to fabricate the desired microelectronic chips on the wafer.

Figure 8:
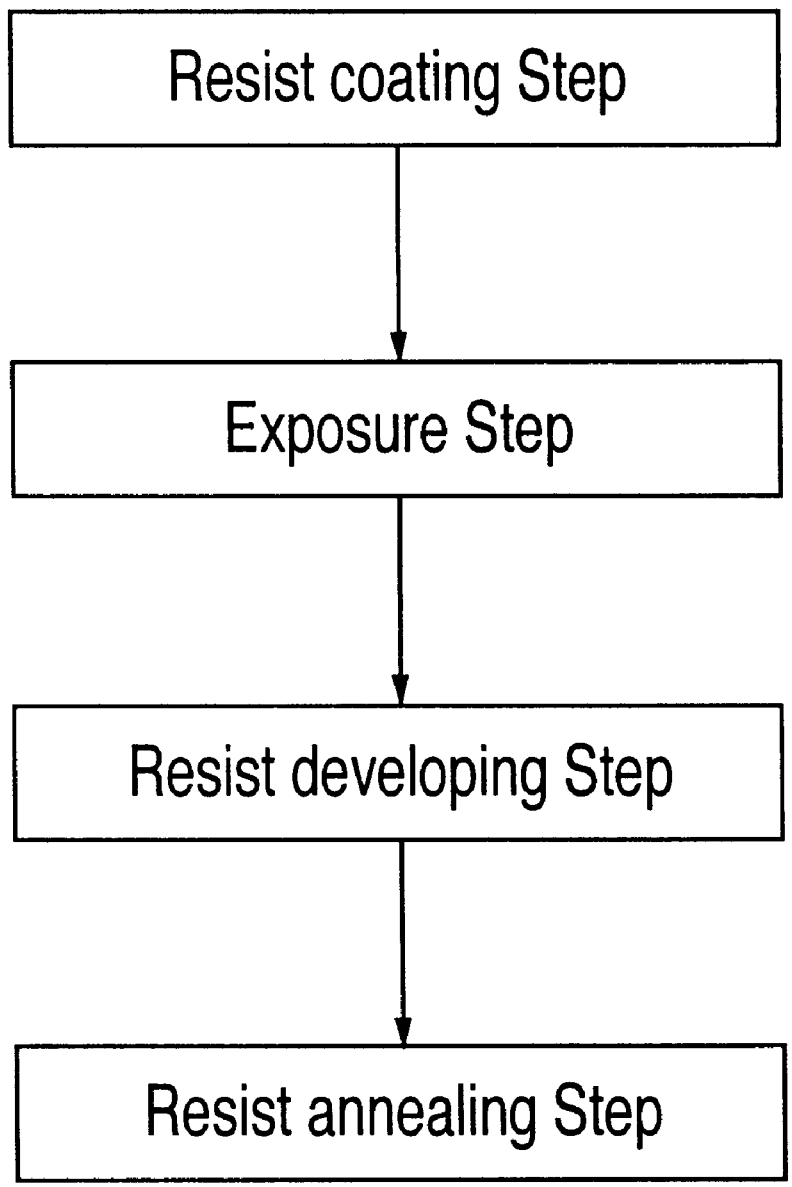
FIG. 8 is a process flow chart for performing a microlithography method according to the invention.
Figure 9:
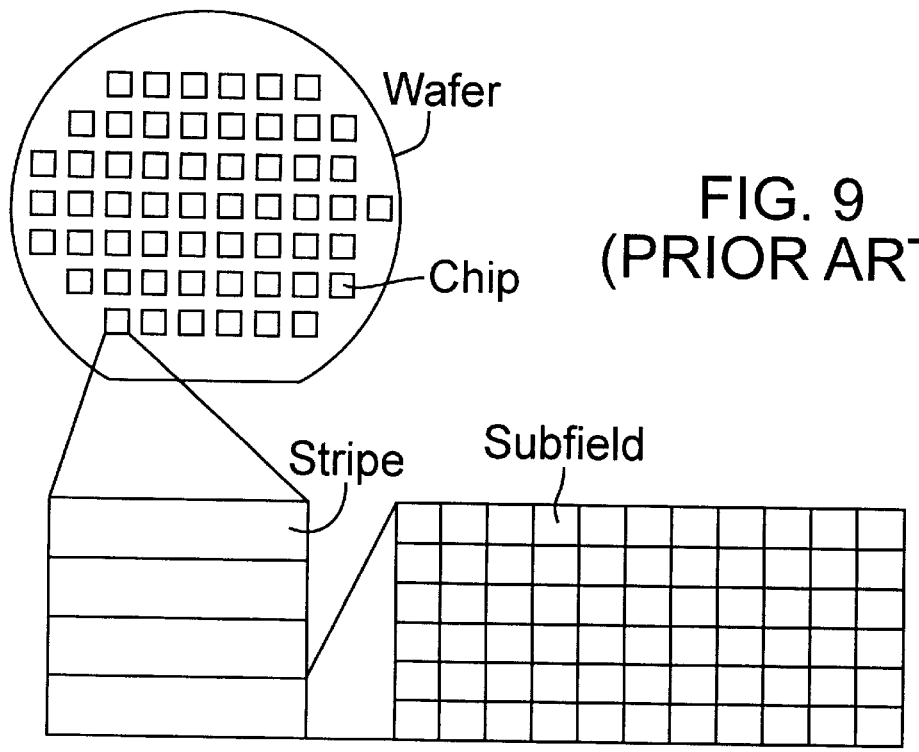
FIG. 9 depicts a conventional wafer showing the intended sites of multiple "chips" or "dies." As exposed, each chip comprises multiple "stripes," and each stripe comprises multiple subfields arranged in rows.
Figure 10:
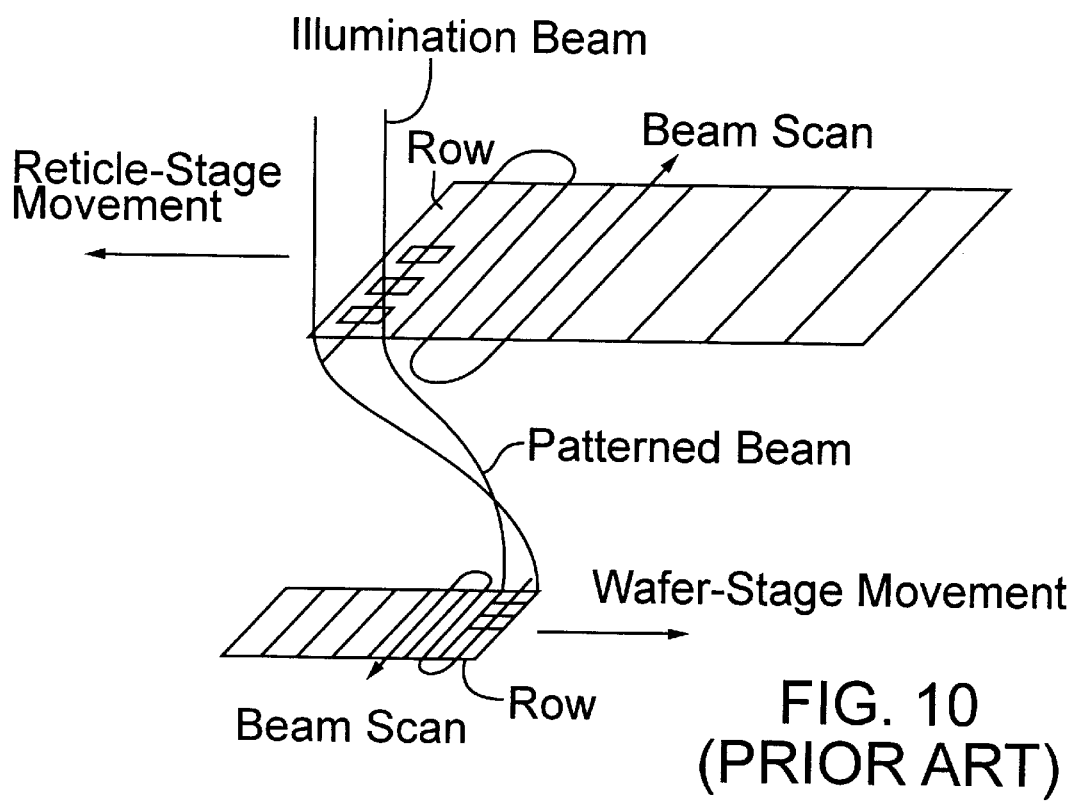
FIG. 10 schematically depicts certain aspects of a conventional projection-exposure of the wafer shown in FIG. 9 using a segmented reticle.

FIG. 8 provides a flowchart of typical steps performed in microlithography, which is a principal step in wafer processing. The microlithography step typically includes: (1) resist-application step, wherein a suitable resist is coated on the wafer substrate (which can include a circuit element formed in a previous wafer-processing step); (2) exposure step, to expose the resist with the desired pattern; (3) development step, to develop the exposed resist to produce the imprinted image; and (4) optional resist-annealing step, to enhance the durability of the resist pattern. For performing microlithography, a CPB microlithography apparatus, such as any of the apparatus described above, is used to transfer a pattern to a wafer. The subject invention results in exposure being performed with substantially no pattern displacement or loss of focus due to temperature changes inside the column of the CPB optical system, thereby providing patterned wafers with high accuracy and acceptable yield.

The process steps summarized above are all well known and are not described further herein.

Whereas the invention has been described in connection with representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. In a charged-particle-beam (CPB) exposure method in which an image of a pattern is transferred to a substrate using a charged particle beam propagating along an optical axis through a lens assembly including a ferrite stack, a method for reducing image displacements caused by temperature fluctuations in the lens assembly, comprising:

determining an allowable range of image displacement caused by the ferrite stack experiencing a temperature change, from its normal operating temperature, within a specified temperature range during exposure;

based on at least one of a ferrite-composition parameter and a ferrite-fabrication parameter, selecting a ferrite for use in the ferrite stack that exhibits, with a change in ferrite temperature from a normal operating temperature within the specified temperature range, a change in permeability sufficiently low so that, if the ferrite experiences a temperature change from the normal operating temperature within the specified temperature range during exposure, the image displacement is within the allowable range; and configuring the lens assembly with a ferrite stack including the selected ferrite.

2. A CPB exposure method, comprising the method of claim 1.

3. A microelectronic-device fabrication method, comprising the steps of:
  (a) preparing a wafer;
  (b) processing the wafer; and
  (c) assembling microelectronic devices on the wafer during steps (a) and (b), wherein step (b) comprises a CPB exposure method as recited in claim 1.

4. A charged-particle-beam (CPB) exposure apparatus for transferring an image of a pattern to a substrate, the apparatus comprising:

a lens assembly comprising at least one of an electromagnetic lens and a deflector arranged relative to an optical axis, the lens assembly including a ferrite stack situated between the optical axis and the at least one of electromagnetic lens and deflector; and the ferrite stack comprising ferrite exhibiting a change in permeability, with a change in temperature from a normal operating temperature of the ferrite stack, resulting in an image displacement, caused by a change in permeability of the ferrite, of 1 nm or less per 0.01° C. temperature change of the ferrite stack from the normal operating temperature during exposure.

5. A microelectronic-device fabrication method, comprising the steps of:
  (a) preparing a wafer;
  (b) processing the wafer; and
  (c) assembling microelectronic devices formed on the wafer during steps (a) and (b), wherein step (b) comprises the steps of (i) applying a resist to the wafer; (ii) exposing the resist; and (iii) developing the resist; and step (ii) comprises providing a CPB exposure apparatus as recited in claim 4; and using the CPB exposure apparatus to expose the resist with the pattern defined on a reticle.

6. A microelectronic device produced by the method of claim 5.

7. A CPB optical component for a charged-particle-beam (CPB) optical system for transferring an image of a pattern to a substrate, comprising a unit of ferrite exhibiting first and second initial magnetization curves for different temperatures, the initial magnetization curves intersecting each other at a preselected magnetic field intensity.

8. The CPB optical component of claim 7, wherein the unit of ferrite exhibits:

a saturation magnetic flux density that decreases with an increase in ferrite temperature relative to a normal operating temperature of the ferrite; and an initial magnetization curve having a positive slope at the normal operating temperature of the ferrite.

9. The CPB optical component of claim 7, wherein the unit of ferrite exhibits:

a saturation magnetic flux density that decreases with an increase in ferrite temperature relative to a normal operating temperature of the ferrite; and a maximum permeability that increases with an increase in ferrite temperature relative to the normal operating temperature of the ferrite.

10. The CPB optical component of claim 7, wherein the unit of ferrite exhibits:

a saturation magnetic flux density that increases with an increase in ferrite temperature relative to a normal operating temperature of the ferrite; and an initial magnetization curve having a negative slope at the normal operating temperature of the ferrite.

11. The CPB optical component of claim 7, wherein the unit of ferrite exhibits:

a saturation magnetic flux density that increases with an increase in ferrite temperature relative to a normal operating temperature of the ferrite; and a maximum permeability that decreases with increases in ferrite temperature relative to the normal operating temperature of the ferrite.

12. The CPB optical component of claim 7, further comprising:

an electromagnetic lens arranged relative to an optical axis, the electromagnetic lens when energized producing a DC magnetic field at the optical axis; and a ferrite stack situated adjacent the electromagnetic lens, the ferrite stack comprising the unit of ferrite.

13. The CPB optical component of claim 12, wherein the preselected magnetic field intensity at which the first and second initial magnetization curves intersect is nearly the same as the intensity of the DC magnetic field.

14. The CPB optical component of claim 13, further comprising a deflector arranged relative to the electromagnetic lens and the optical axis, the deflector when electrically energized producing an AC magnetic field at the optical axis, wherein the ferrite stack is situated adjacent the deflector and the electromagnetic lens.

15. The CPB optical component of claim 14, wherein the preselected magnetic field intensity at which the first and second initial magnetization curves intersect is nearly the same as a sum of the intensity of the DC magnetic field and the intensity of the AC magnetic field.

16. The CPB optical component of claim 15, wherein:
  operation of the deflector and the electromagnetic lens causes a B-H curve of the ferrite to exhibit a local loop having a center; and the center corresponds to a magnetic field intensity that exhibits substantially no change with changes in the ferrite temperature relative to the normal operating temperature of the ferrite.

17. The CPB optical component of claim 7, further comprising:
   a deflector arranged relative to an optical axis, the deflector when electrically energized producing an AC magnetic field at the optical axis; and
   a ferrite stack situated adjacent the deflector, the ferrite stack comprising the unit of ferrite.

18. The CPB optical component of claim 17, wherein the preselected magnetic field intensity at which the first and second initial magnetization curves intersect is nearly the same as the intensity of the AC magnetic field.

19. A CPB optical system, comprising the CPB optical component of claim 7.

20. A CPB exposure apparatus, comprising the CPB optical system of claim 19.

21. A microelectronic-device fabrication method, comprising the steps of:
   (a) preparing a wafer;
   (b) processing the wafer; and
   (c) assembling microelectronic devices formed on the wafer during steps (a) and (b), wherein step (b) comprises the steps of (i) applying a resist to the wafer; (ii) exposing the resist; and (iii) developing the resist; and step (ii) comprises providing a CPB exposure apparatus as recited in claim 20; and using the CPB exposure apparatus to expose the resist with the pattern defined on a reticle.

22. A microelectronic device produced by the method of claim 21.

* * * * *

UNITED STATES PATENT AND TRADEMARK OFFICE
CERTIFICATE OF CORRECTION

PATENT NO.   : 6,566,663 B1                                                     Page 1 of 1
DATED        : May 20, 2003
INVENTOR(S)  : Kamijo et al.

It is certified that error appears in the above-identified patent and that said Letters Patent is hereby corrected as shown below:

Column 8,
Line 14, "(see FIG. 3);" should be -- (see FIG. 3), --.

Column 9,
Line 57, "permeability $p_i$." should be -- permeability $\mu_i$ --.

Column 10,
Line 40, "HI DC," should be -- $H_{1DC}$, --.
Line 49, "$H_{1DC}$ The" should be -- $H_{IDC}$. The --.

Column 13,
Line 15, "modem" should be -- modern --.

Signed and Sealed this

Thirtieth Day of December, 2003

JAMES E. ROGAN
*Director of the United States Patent and Trademark Office*